(12) United States Patent
Bae et al.

(10) Patent No.: US 12,453,032 B2
(45) Date of Patent: Oct. 21, 2025

(54) INVERTER DEVICE

(71) Applicant: LS ELECTRIC CO., LTD., Anyang-si (KR)

(72) Inventors: Tae Suk Bae, Anyang-si (KR); Dong Sik Kim, Anyang-si (KR); Chun Suk Yang, Anyang-si (KR)

(73) Assignee: LS ELECTRIC CO., LTD., Anyang-si (KR)

( * ) Notice: Subject to any disclaimer, the term of this patent is extended or adjusted under 35 U.S.C. 154(b) by 178 days.

(21) Appl. No.: 18/282,931

(22) PCT Filed: Nov. 25, 2021

(86) PCT No.: PCT/KR2021/017489
§ 371 (c)(1),
(2) Date: Sep. 19, 2023

(87) PCT Pub. No.: WO2022/203155
PCT Pub. Date: Sep. 29, 2022

(65) Prior Publication Data
US 2024/0164041 A1    May 16, 2024

(30) Foreign Application Priority Data
Mar. 23, 2021    (KR) .................. 10-2021-0037276

(51) Int. Cl.
*G06F 1/16*        (2006.01)
*H02M 7/00*        (2006.01)
(Continued)

(52) U.S. Cl.
CPC ........ *H05K 7/14324* (2022.08); *H02M 7/003* (2013.01); *H05K 7/14322* (2022.08)

(58) Field of Classification Search
CPC .............. H02M 7/003; H05K 7/14324; H05K 7/14322
See application file for complete search history.

(56) References Cited

U.S. PATENT DOCUMENTS 4,401,351 A    8/1983    Record
5,497,289 A *  3/1996    Sugishima ............. H05K 7/209
                                                361/600

(Continued)

FOREIGN PATENT DOCUMENTS

CN    212183866 U    12/2020
JP    05071862 A     3/1993

(Continued)

OTHER PUBLICATIONS

International Search Report for related International Application No. PCT/KR2021/017489; action dated Sep. 29, 2022; (2 pages).

(Continued)

*Primary Examiner* — Anthony M Haughton
(74) *Attorney, Agent, or Firm* — K&L Gates LLP

(57) ABSTRACT

An inverter device is provided. The inverter device according to an embodiment of the present disclosure may include: a main body housing in which an optional module is detachably installed and a first circuit module is disposed inside, and the inverter device may include an optional module installation portion; an opening portion formed in the optional module installation portion; and a connection member insertion portion disposed in the opening portion.

10 Claims, 10 Drawing Sheets

(51) Int. Cl.
    *H05K 5/00*         (2025.01)
    *H05K 7/00*         (2006.01)
    *H05K 7/14*         (2006.01)

(56) References Cited

U.S. PATENT DOCUMENTS

| | | | | |
|---|---|---|---|---|
| 5,926,627 | A * | 7/1999 | Sugimura | G06F 1/1632 |
| | | | | 361/679.42 |
| 2015/0249420 | A1* | 9/2015 | Vitrano | H02P 27/04 |
| | | | | 318/494 |
| 2017/0244197 | A1* | 8/2017 | Takahashi | H01R 13/514 |
| 2019/0165687 | A1* | 5/2019 | Yamazawa | C09J 7/22 |

FOREIGN PATENT DOCUMENTS

| | | | |
|---|---|---|---|
| JP | 06311760 | A | 11/1994 |
| JP | 2010028893 | A | 2/2010 |

OTHER PUBLICATIONS

Written Opinion for related International Application No. PCT/KR2021/017489; action dated Sep. 29, 2022; (3 pages).

\* cited by examiner

INVERTER DEVICE

CROSS-REFERENCE TO RELATED APPLICATIONS

This application is a National Stage filing under 35 U.S.C. 371 of International Application No. PCT/KR2021/017489, filed on Nov. 25, 2021 which claims priority of Korean Patent Application No. 10-2021-0037276, filed Mar. 23, 2021, the entire content of which is incorporated herein by reference.

FIELD

The present invention relates to an inverter device, and more particularly, to an inverter device that can be used by additionally combining an option module according to a use environment.

BACKGROUND

In general, the inverter is a static power conversion device for converting DC power into AC power, and also referred to as an inverse converter. On the contrary, a converter or a rectifier is a device for converting AC power into DC power. However, recently, there has been a tendency to include a converter function for converting AC to DC and an inverter function for converting DC to AC within the inverter.

The inverter is largely composed of a main body housing, a terminal unit connected to an input/output line, a power module for supplying power, a filter unit for performing a rectifier function, a capacitor for storing power, and an electronic circuit module including a control unit for control.

The inverter is used in various types in the industry, such as pens, pumps, elevators, transfer devices, and production lines, and the like. Recently, as the number of industrial fields for converting a power source from an internal combustion engine to a motor increases, the fields in which inverters are used are also diversifying.

In particular, as the industrial field diversifies, various specifications of inverters produced according to individual industrial sites are being sued.

Conventionally, in order to solve the cost increase and improvement problems that may arise due to production of various specifications of the inverter, a basic type of inverter device has been designed, and then option modules have been additionally installed to respond to various environments.

However, the conventional optional module has been inconvenient in that the optional module must be coupled to the main body housing after a separate bracket is assembled by disassembling the front portion of the main body housing and then the optional module is connected to the front portion of the main body housing.

In particular, from the user's point of view, not only is it not easy to disassemble and reassemble itself, a separate tool is required, and there is a problem that the option module cannot be combined unless a separately necessary bracket is secured. In addition, there was a problem that there was a high possibility of failure during disassembly and reassembly.

Accordingly, there has been a need for an inverter device capable of responding to various industrial sites by easily coupling an option module to a main body housing regardless of a user's skill level.

SUMMARY

An object of the present disclosure is to provide an inverter device that can be used in various environments by mounting an optional module without modifying or switching a component of the inverter device.

An object of the present disclosure is to provide an inverter device in which an option module can be mounted without a separate tool or component.

An object of the present disclosure is to provide an inverter device in which an option module can be easily mounted regardless of a user's skill level.

An object of the present disclosure is to provide an inverter device capable of reducing manufacturing costs and manufacturing time by reducing and simply designing components for coupling an optional module.

The technical problems of the present disclosure are not limited to the above-mentioned technical problems, and other technical problems not mentioned may be clearly understood by those skilled in the art from the following description.

To solve the above problems, an inverter device according to an aspect of the present disclosure may include a main body housing in which an optional module is detachably installed and a first circuit module is disposed inside, wherein the inverter device may include: an optional module installation portion provided on a front surface of the main body housing to install the optional module; an opening portion formed in the optional module installation portion; and a connection member insertion portion disposed in the opening portion to connect a connection member provided in the optional module, and wherein the optional module installation portion may include: at least one optional module fastening hole formed in the main body housing; and at least one optional module fastening groove spaced apart from the optional module fastening hole, and wherein the optional module may include: an optional module housing having a second circuit module; at least one first protrusion portion coupled to the optional module fastening hole; and at least one second protrusion portion coupled to the optional module fastening groove, and wherein the connection member is capable of being coupled to the connection member insertion portion to allow the second circuit module to be electrically connected to the first circuit module.

In this case, the optional module fastening hole may be formed at a lower side of a front surface of the main body housing, and wherein the optional module fastening groove is formed at an inner side of a through portion formed at an upper side of the optional module coupling hole.

In this case, the connection member may include a connector inserted into the connection member insertion portion; and a cable formed of a flexible member to electrically connect the connector and the second circuit module.

In this case, the inverter device further ay include an manipulation unit disposed on a front surface of the main body housing to control the first circuit module, wherein the manipulation unit controls the first circuit module and the second circuit module connected to the first circuit module.

In this case, the optional module may include a fixing member fastening portion formed at one side of the opening portion; and a fixing member coupled to the fixing member fastening portion, and wherein the optional module comprises an optional module cover disposed in front of the second circuit module and coupled to the optional module housing, and wherein the fixing member passes through a first through hole formed in the optional module cover and a second through hole formed in the optional module housing to fix the optional module to the main body housing.

In this case, the fixing member may be rotatably fixed to the optional module cover or the optional module housing.

In this case, the fixing member may include a screw portion having one end thereof threadedly coupled to the fixing member fastening portion by passing through the first through hole and the second through hole; and a head portion formed at the other end of the screw portion to rotate the screw portion.

In this case, the first protrusion portion and the second protrusion portion may be formed with an upward bend towards the front end, a first protrusion guide surface having a curved shape is formed on a lower surface of the first protrusion portion so that the optional module is coupled to the inverter device along the first protrusion portion, and a second protrusion guide surface having a curved shape is formed on a lower surface of the second protrusion portion so that the optional module is coupled to the inverter device along the second protrusion portion.

In this case, the electronic device may further include a cover covering the opening portion, wherein a cover seated groove formed around the opening portion to install the cover.

In this case, the cover may include a plate formed to correspond to the cover seated groove, wherein at least one cover fixing protrusion is formed on an inner circumferential surface of the cover seated groove, and the plate is fitted into the cover seating groove by the cover fixing protrusion.

In this case, the cover may include a cover fastening hole formed in a lower portion of the cover seated groove, the cover comprises: a first cover fastening portion protruding from a lower side of the plate to be inserted into the cover fastening hole; and a second cover fastening portion protruding from an upper side of the plate toward the main body housing to be contacted with an inner circumferential surface of the opening portion and having a fixing protrusion protruding from a front end to prevent separation from the opening portion.

In this case, the cover may further include a plate groove portion formed at an upper side of the plate to separate the cover from the cover fastening hole. The inverter device according to an embodiment of the present disclosure may be used in various environments by mounting the optional module without modifying or switching a component of the inverter device.

The inverter device according to an embodiment of the present disclosure may be mounted with the optional module without a separate tool or component.

The inverter device according to an embodiment of the present disclosure may be easily mounted with the optional module regardless of the skill of the user.

The inverter device according to an embodiment of the present disclosure may reduce manufacturing costs and manufacturing time by reducing and simply designing components for coupling the optional module.

It should be understood that the effects of the present disclosure are not limited to the above-described effects, and include all effects that can be inferred from the construction of the disclosure described in the description or the claims.

DETAILED DESCRIPTION

Figure 1:
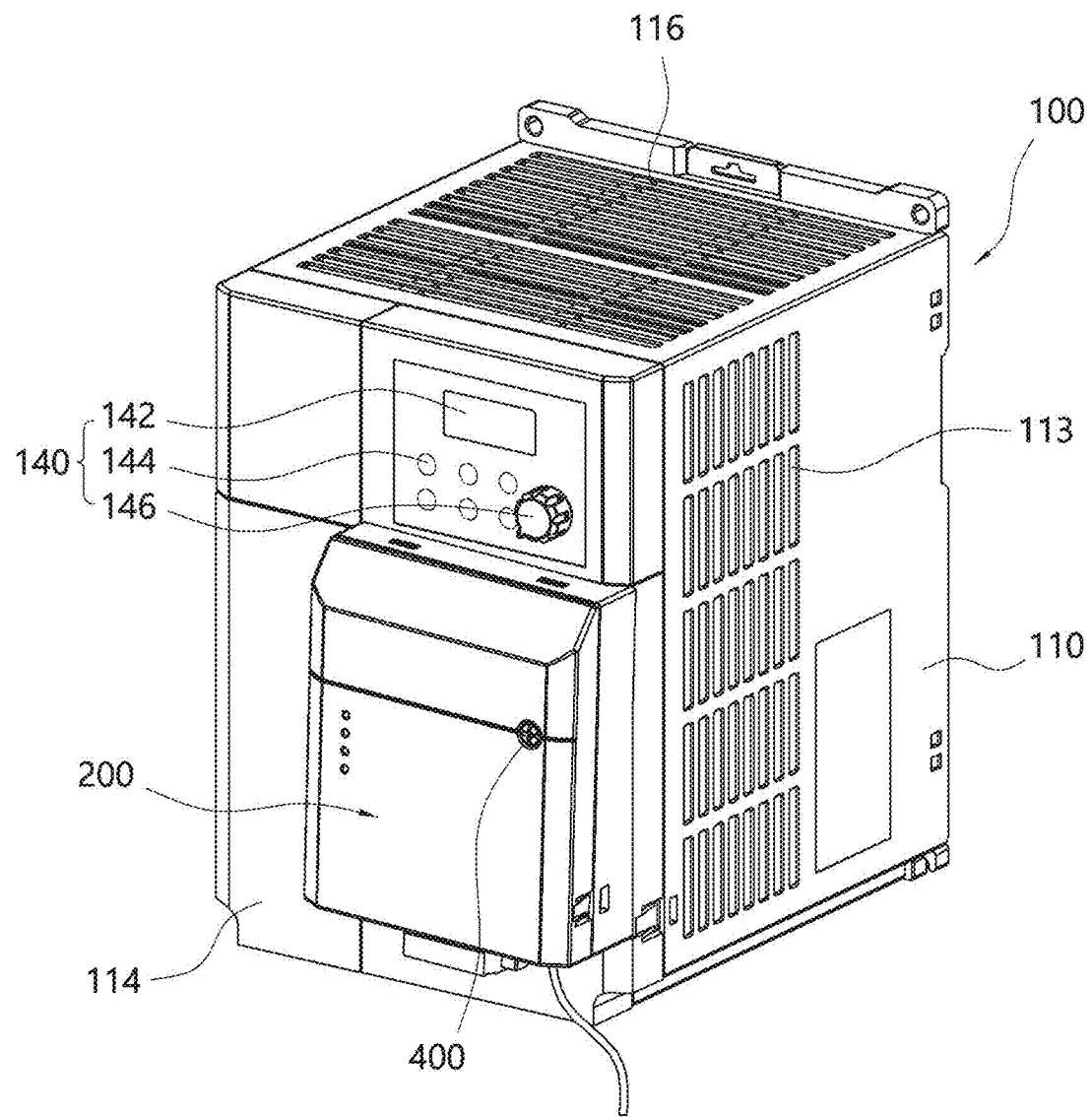
FIG. 1 is a perspective view of an inverter device according to an embodiment of the present disclosure.

Hereinafter, embodiments of the present invention will be described in detail with reference to the accompanying drawings so that those skilled in the art can easily carry out the present invention. The present invention may be embodied in various different forms and is not limited to the embodiments described herein. The terms used in the embodiments of the present invention may be interpreted in a general sense known to those skilled in the art unless otherwise defined.

In the drawings, parts irrelevant to the description are omitted to clearly describe the present invention, and the same or similar elements are denoted by the same reference numerals throughout the specification.

Hereinafter, the direction of the X-axis in FIG. 1 is defined as a forward direction, the direction of the Y-axis in FIG. 1 is defined as a right direction, and the direction of the Z-axis in FIG. 1 is defined as an upward direction, and the expression connected is defined to include direct connection as well as indirect connection through another configuration.

Terms such as 'first', 'second', etc., may be used to describe various elements, but the elements should not be limited by the above terms. The above terms may be used only to distinguish one element from another. For example, 'first element' may be referred to as 'second element' without departing from the scope of the present invention, and similarly, 'second element' may be referred to as 'first element'.

The present invention provides an inverter device that can be used in various environments by mounting an option module without modifying or switching component of the inverter device, and provides an inverter device that can easily mount an option module regardless of user's skill level without separate tools or component.

Figure 2:
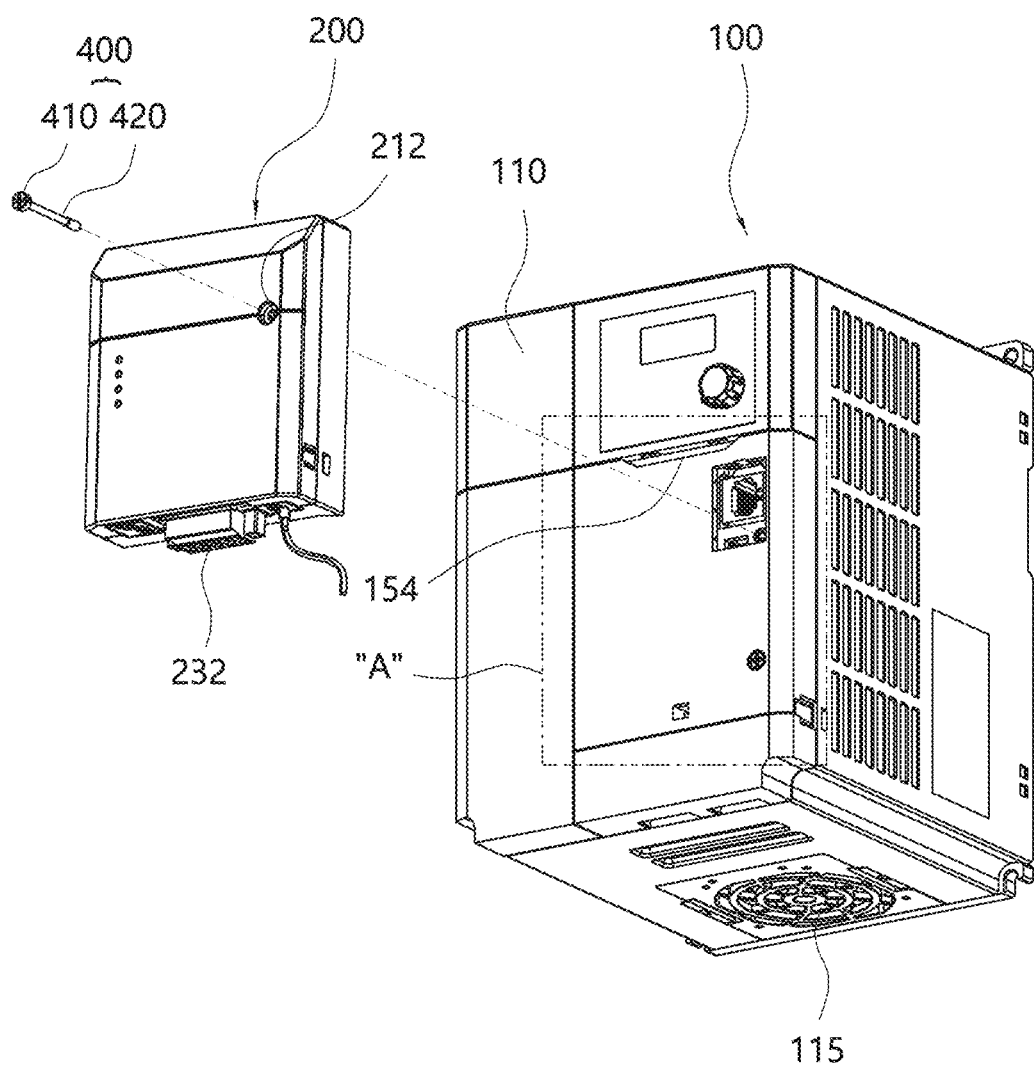
FIG. 2 is an exploded perspective view of an inverter device according to an embodiment of the present disclosure.
Figure 3:
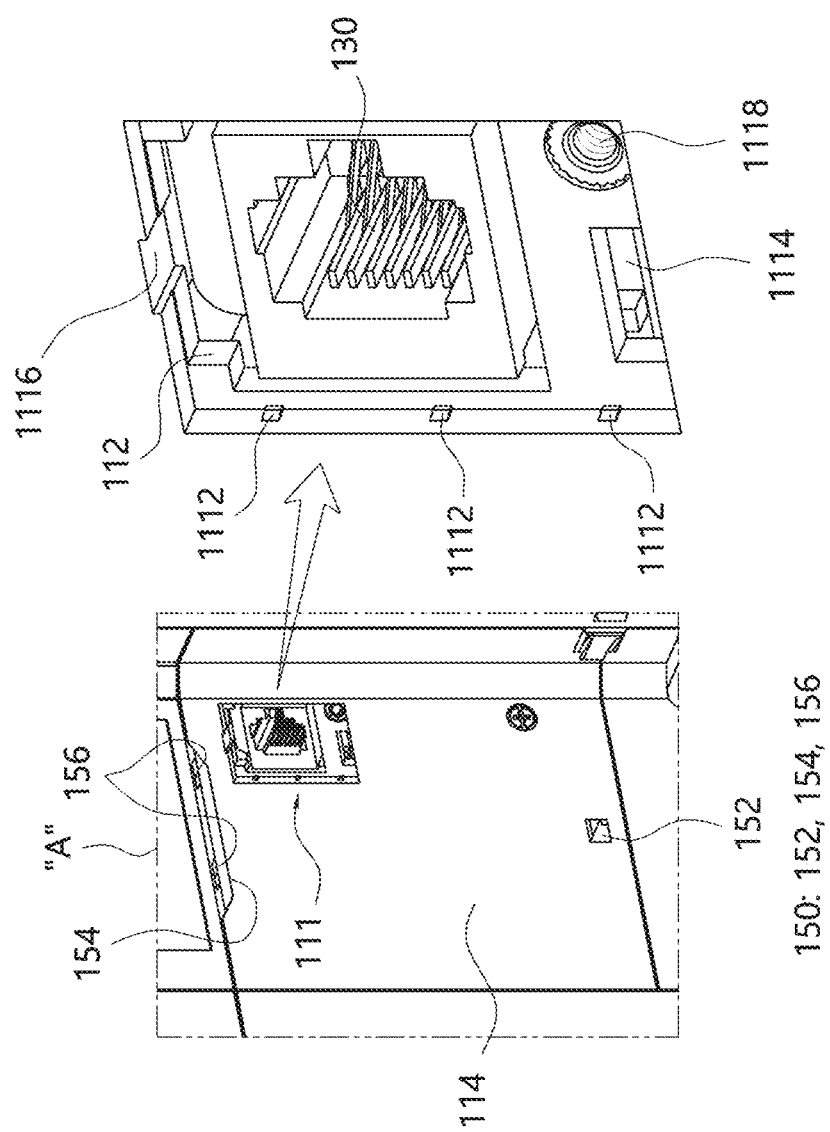
FIG. 3 is a view showing an enlarged portion A of a front surface of a main body housing shown FIG. 2.

FIG. 1 is a perspective view of an inverter device according to an embodiment of the present invention. FIG. 2 is an exploded perspective view of an inverter device according to an embodiment of the present invention. FIG. 3 is a view showing an enlarged portion A of a front surface of a main body housing shown in FIG. 2.

As shown in FIG. 1, the inverter device 100 according to an embodiment of the present invention includes a main body housing 110, a first circuit module (not shown), an manipulation unit 140, and a connection member insertion unit 130.

Referring to FIG. 1, the body housing 110 is formed in a box shape in which a space is provided therein. A plurality of heat dissipation holes 113 may be formed on a side surface of the main body housing 110 so that heat generated in an internal space of the main body housing 110 may be discharged to the outside.

As shown in FIG. 1, an air inlet 115 through which external fluid may be introduced is formed on a lower surface of the main body housing 110, and as shown in FIG. 2, an air outlet 116 is formed at an upper surface of the main body housing 110 so that air introduced into the lower surface may absorb internal heat and be discharged to the outside.

A pen (not shown) may be disposed at a lower end portion of an inside of the main body housing 110 so that air may be smoothly introduced into the main body housing 110 through the air inlet 115.

As shown in FIG. 2, an optional module 200 to be described below is disposed in a central portion of a front surface of the main body housing 110. In this case, the optional module installation unit 150 is provided on a front surface of the main body housing 110 so that the optional module 200 may be installed in the main body housing 110.

The optional module installation portion 150 of the inverter device 100 according to an embodiment of the present invention includes a through portion 154, an optional module fastening groove 156 and an optional module fastening hole 152.

The through portion 154 is formed to extend longitudinally in the Y-axis direction at an upper side of the central portion of the main body housing 110 to pass through the inside and outside of the main body housing 110.

The shape of the through portion 154 is preferably formed in a shape of an isosceles trapezoid arranged in reverse as shown in FIG. 3, but the shape is not limited thereto.

At least one, for example, two optional module fastening grooves 156 are formed at the upper side of an inner circumferential surface of the through portion 154 as shown in FIG. 3. As shown in FIG. 3, the optional module fastening grooves 156 are preferably formed to be concave upward from an upper side of the inner circumferential surface of the through portion 154 in a rectangular shape.

The number of optional module fastening grooves 156 may vary depending on a length of the through portion 154. This may be formed differently depending on a size of the optional module 200 expected to be installed in the main body housing 110 in order to more firmly couple the optional module 200 to the main body housing 110.

Further, as shown in FIG. 3, at least one optional module fastening hole 152 is formed in a lower portion of a central portion of the main body housing 110. The shape of the optional module fastening hole 152 preferably has a rectangular shape as shown in FIG. 3, but the shape is not limited thereto.

The number of optional module fastening holes 152 may be installed similarly to the optional module fastening grooves 156, and may be designed differently depending on the type of optional module 200.

At this time, the first protrusion portion 223 and the second protrusion portion 224, which will be described later, are inserted into the optional module fastening groove 156 and the optional module fastening hole 152. The structure thereof will be described in detail when describing the optional module 200 to be described later.

As shown in FIG. 3, the cover seated groove 111 is formed to be concavely backward at the center of the front surface 114 of the main body housing 110 on which the optional module 200 is disposed. The cover 300 to be described later is seated in the cover seated groove 111.

As shown in FIG. 3, a groove portion 1116 is formed at an upper end of the cover seated groove 111, and a cover fastening hole 1114 is formed at a center of a lower end of the cover seated groove 111.

As shown in FIG. 3, a fixing member fastening portion 1118 is formed on one side of the cover seated groove 111, preferably on the right side of the cover fastening hole 1114. The fixing member 400 described later is coupled to the fixing member fastening portion 1118.

As shown in FIG. 3, an opening portion 112 is formed at a central portion of the cover seated groove 111. The outside and the inside of the main body housing 110 pass through the opening portion 112.

At this time, the connection member insertion portion 130 is disposed on the inner side of the main body housing 110 of the opening portion 112. Accordingly, the connection member 240 to be described later is coupled to the connection member inserting portion 130 disposed in the main body housing 110 by passing through the main body housing 110 through the opening portion 112.

The connection member inserting portion 130 may use a variety of well-known parts as long as they can be connected to the connection member 240 so as to be energized, and the embodiment is not limited thereto. For example, an elastic fixing portion is formed on one side of the connection member 240 and may be formed of a connecting pin and a connecting pin insertion portion fixed by the restoring force of the elastic fixing portion in a state inserted into the connection member inserting portion 130.

The connection member insertion portion 130 is connected to a first circuit module (not shown) disposed inside the main body housing 110 so as to be energized. The first circuit module (not shown) may be connected to an external component through the connection member insertion unit 130.

On the other hand, an inverter is disposed as a power converter inside the body housing 110, in the present specification, a power module (not shown) for supplying power to operate as an inverter, a filter unit (not shown) in charge of a rectification function, a capacitor (not shown) in charge of a storage function, and a control unit (not shown) in charge of control are defined as a first circuit module. That is, the first circuit module (not shown) is fixed inside the main body housing 110.

An manipulation unit 140 is disposed on a front surface of the main body housing 110 to control a first circuit module (not shown). As illustrated in FIG. 1, the manipulation unit 140 is preferably disposed on the right upper end of the front surface of the main body housing 110.

As shown in FIG. 1, the manipulation unit 140 of the inverter device 100 according to an embodiment of the present invention includes a display 142, a button unit 144, and a rotation switch 146.

The display 142 displays the state of the inverter device. As the display 142, known display devices such as LCD and LED may be used, and the embodiment is not limited thereto.

As shown in FIG. 1, the display 142 is preferably disposed on the upper side of the manipulation unit 140 and extends longitudinally in the Y-axis direction.

A button 144 is disposed below the display 142 to allow the user to input information to the manipulation unit 140 to control the inverter. In addition, a rotary switch 146 may be disposed on the right side of the button 144.

Figure 4:
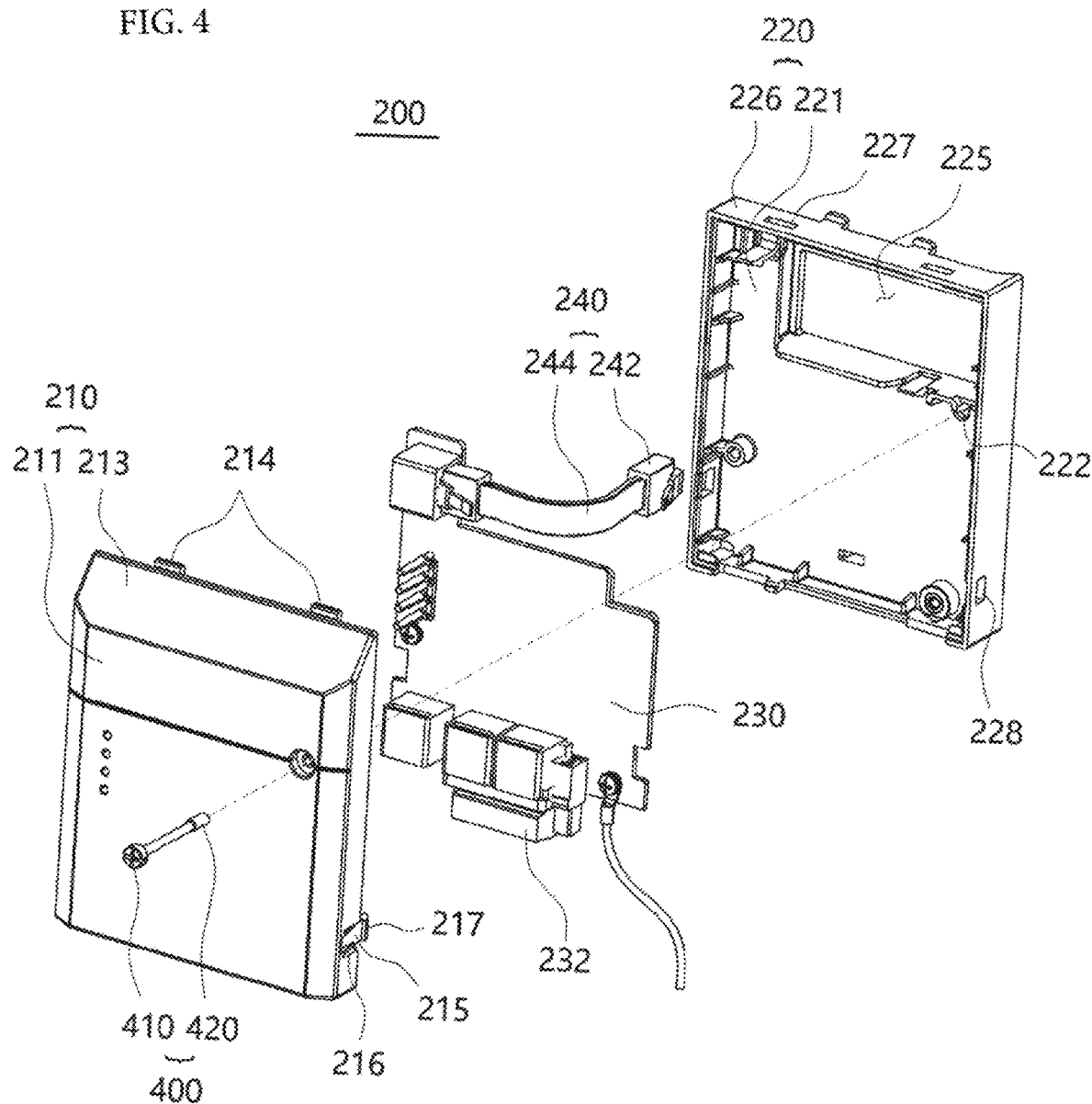
FIG. 4 is an exploded perspective view of an optional module according to an embodiment of the present disclosure.
Figure 5:
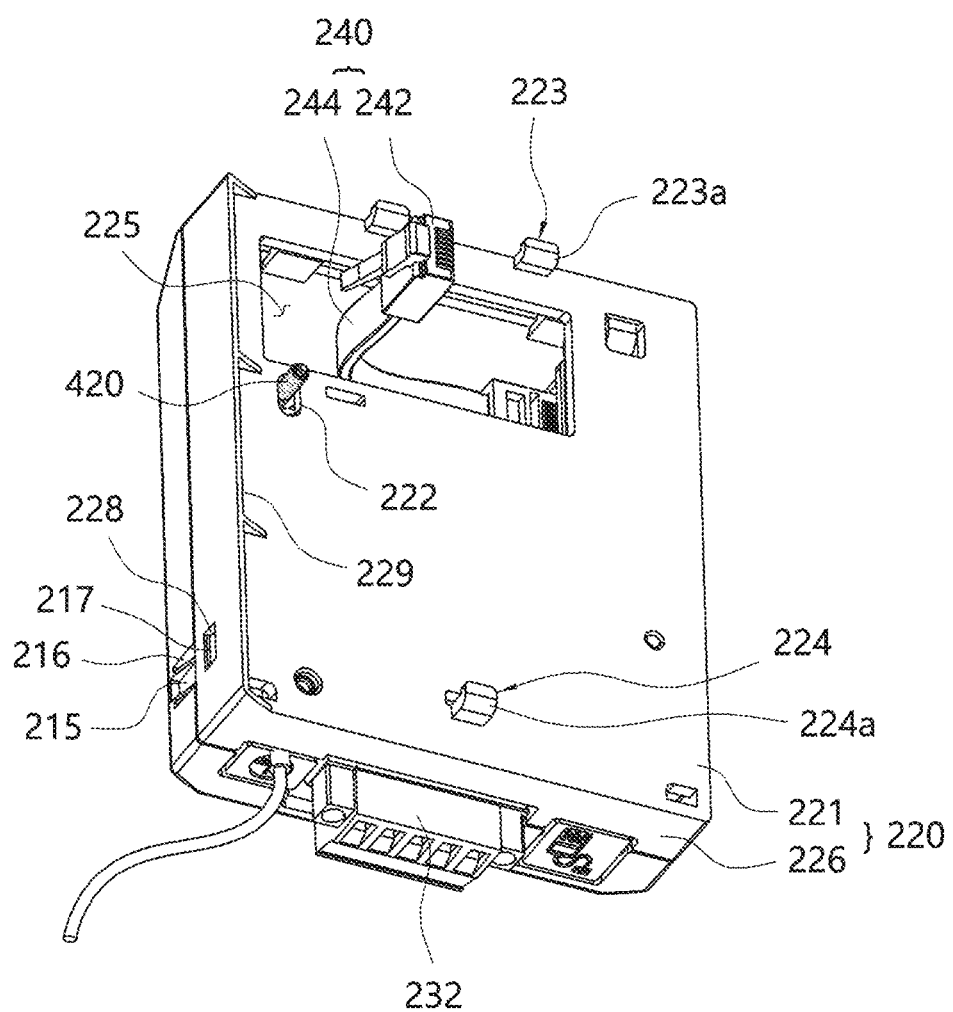
FIG. 5 is a rear perspective view of an optional module according to an embodiment of the present disclosure.

FIG. 4 is an exploded perspective view of an optional module according to an embodiment of the present invention. FIG. 5 is a rear perspective view of an optional module according to an embodiment of the present invention.

The optional module 200 of the inverter device 100 according to an embodiment of the present invention includes an optional module housing 220, an optional module cover 210, a second circuit module 230, and a connection member 240.

As shown in FIG. 4, the optional module housing 220 includes a rectangular plate-shaped housing bottom portion 221 and a housing sidewall portion 226 formed to extend forward from the periphery of the housing bottom portion 221.

In this case, as shown in FIG. 4, the housing through portion 225 is formed on the housing bottom portion 221 to be penetrated to the rear side. The housing through portion 225 is formed at a position corresponding to the opening portion 112 of the main body housing 110 in a state in which the optional module 200 is mounted on the main body housing 110. Accordingly, the connection member 240 may be inserted into the connection member inserting portion 130 through the housing through portion 225 and the opening portion 112.

At least one first cover fastening hole 227 may be formed in the upper portion of the housing sidewall portion 226, for example, two, as shown in FIG. 4. The number of first cover fastening holes 227 may be differently formed depending on the size of the optional module 200. A first fastening portion 214 to be described later is coupled to the first cover fastening hole 227.

At least one second cover fastening hole 228 may be disposed on the side of the housing sidewall portion 226, for example, two symmetrically disposed on both left and right sides, as shown in FIG. 4. The number of second cover fastening holes 228 may be changed according to a size of the optional module 200, similarly to the first cover fastening holes 227. In this case, a second fastening portion 215 is coupled to the second cover fastening hole 228.

An optional module cover 210 is disposed on a front side of the optional module housing 220. The optional module cover 210 includes a cover bottom portion 211 formed to correspond to the housing bottom portion 221 and a cover sidewall portion 213 formed to extend from a periphery of the cover bottom portion 211 toward the rear side.

A first fastening portion 214 protruding backward from an inner side surface of the cover sidewall portion 213 and bending upward toward a front end is provided at an upper end of the cover sidewall portion 213. In this case, the first fastening portion 214 may be integrally formed with the cover sidewall portion 213.

The number of the first fastening portions 214 may be two as shown in FIG. 4, but the number is not limited thereto, and the number may vary depending on the size of the optional module 200.

The first fastening portion 214 has the front end fitted into the first cover fastening hole 227. In this case, by the bending shape of the first fastening portion 214, the user may pull the lower end of the optional module cover 210 forward while the first fastening portion 214 is fitted into the first cover fastening hole 227, rotate the front end of the option module cover 210 around the axis, and then may separate the optional module cover 210 from the optional module housing 220.

As shown in FIG. 4, a second fastening portion 215 protruding backward from the cover sidewall portion 213 is provided at a side portion of the cover sidewall portion 213.

In this case, the second fastening portion 215 may be integrally formed with the cover sidewall portion 213.

The second fastening portion 215 is elastically deformed toward the inside of the optional module 200 such that the optional module cover 210 is coupled to the front of the optional module housing 220 to come into contact with the inner circumferential surface of the housing sidewall portion 226.

In this case, as shown in FIG. 4, the second fastening portion 215 of the inverter device 100 according to an embodiment of the present invention may include a fastening protrusion 217 and an elastic providing groove 216.

The fastening protrusion 217 protrudes outward from a front end of the second fastening portion 215. Accordingly, as shown in FIG. 5, the fastening protrusion 217 is inserted into the second cover fastening hole 228 formed in the housing sidewall portion 226 of the optional module housing 220.

At this time, the state in which the fastening protrusion 217 is inserted into the second cover fastening hole 228 can be maintained by the elastic restoring force of the second fastening porting 215.

Meanwhile, elastic providing grooves 216 are formed at both sides of the second fastening portion 215 so that the second fastening portion 215 is easily elastically deformed.

In more detail, referring to FIG. 4, the rear end of the cover sidewall portion 213 is concavely formed from both sides of the second fastening portion 215 toward the front side. Accordingly, the elastic providing groove 216 may widen the range in which the second fastening portion 215 may be elastically deformed, and the second fastening portion 215 may provide a larger restoring force, thereby allowing the optional module cover 210 and the optional module housing 220 to be more firmly coupled. In addition, it is possible to reduce the occurrence of a breakage situation in the process of separating the second fastening portion 215 from the second cover fastening hole 228.

Meanwhile, the second circuit module 230 is disposed in a space formed inside the option module 200 due to the combination of the option module cover 210 and the option module housing 220.

The second circuit module 230 is connected to the first circuit module (not shown) to add a new function or increase performance to an inverter function operating only with the first circuit module (not shown).

As shown in FIG. 4, a connection terminal 232 may be provided at a lower portion of the second circuit module 230 to connect an external device and the second circuit module 230. The connection terminal 232 is preferably disposed to protrude downward from inside the optional module cover 210 and the optional module housing 220.

In this case, the connection member 240 is provided so that the second circuit module 230 can be connected to the first circuit module (not shown).

The connection member 240 is coupled to the connection member insertion portion 130 disposed in the main body housing 110 through the housing through portion 225 formed in the housing bottom portion 221 of the optional module housing 220.

Referring to FIG. 5, The connection member 240 includes a cable 244 having one end electrically connected to the second circuit module 230 and a connector 42 connected to the other end of the cable 244. In this case, the connector 242 is inserted into and coupled to the connection member insertion portion 130, so that the first circuit module (not shown) and the second circuit module 230 are electrically connected, and the user may control the first circuit module (not shown) and the second circuit module 230 through the manipulation portion 140.

At this time, the cable 244 is formed flexible. Accordingly, the user may easily pull the connector 242 from the optional module 200 and first insert the connector 242 into the connection member insertion portion 130, and may couple the connector 242 to the connection member insertion portion 130 and then couple the optional module 200 to the main body housing 110.

The optional module 200 of the inverter device 100 according to an embodiment of the present invention may further include a support unit 229.

As shown in FIG. 5, the support portion 229 is formed to extend from the right side of the housing sidewall portion 226 to the rear side. In this case, the shape of the support portion 229 is formed to correspond to the shape of the right edge of the front surface 114 of the main body housing 110 in a state in which the housing bottom portion 221 of the optional module housing 220 is fixed to the front surface 114 of the main body housing 110.

Accordingly, the support part 229 supports the housing bottom portion 221 to prevent a right side of a rear surface of the housing bottom potion 221 from being spaced apart from the front surface 114 of the main body housing 110 according to the shape of the main body housing 110, thereby allowing the optional module 200 to be more firmly coupled to the main body housing 110.

Meanwhile, as shown in FIG. 5, in order for the optional module 200 to be coupled to the inverter device 100 according to an embodiment of the present invention, the optional module 200 includes a first protrusion portion 223, a second protrusion portion 224, and a fixing member 400.

As shown in FIG. 5, the first protrusion portion 223 protrudes from an upper end of the option module housing 220 toward a rear side. At this time, the first protrusion portion 223 is bent toward an upper side toward a front end of the rear side.

As described above, the front end of the first protrusion portion 223 bent toward the upper side is coupled to the option module fastening groove 156 formed at the upper side of the inner circumferential surface of the through portion 154 of the main body housing 110.

To this end, the shape of the cross section of the front end of the first protrusion portion 223 and the cross section of the optional module coupling groove 156 may be formed to correspond to each other.

A first protrusion guide surface 223a formed on the lower surface of the first protrusion portion 223 to be curved in a direction in which a front end is bent toward an upper side is formed. The first protrusion guide surface 223a comes into contact with the lower side of the through portion 154 during the process of coupling the first protrusion portion 223 to the optional module coupling groove 156.

Accordingly, the front end of the first protrusion portion 223 may be easily inserted into the optional module fastening groove 156 along the curved surface of the first protrusion guide surface 223a while being supported from the lower side of the inner circumferential surface of the through portion 154 by the first protrusion guide surface 223a.

The number of the first protrusion portions 223 is preferably two as shown in FIG. 5 so as to correspond to the number of the optional module coupling grooves 156, but the number of the first protrusion portions 223 is not limited thereto and may vary depending on the size of the optional module 200.

As shown in FIG. 5, the second protrusion portion 224 protrudes backward from a lower end of the optional module housing 220. In this case, the second protrusion portion 224 is bent toward an upper side as it goes to the front end of the rear side like the first protrusion portion 223.

The front end bent toward the upper side of the second protrusion portion 224 is coupled to the optional module fastening hole 152 formed in the front surface 114 of the main body housing 110, as described above.

To this end, the shape of the cross-section of the second protrusion portion 224 and the cross-section of the optional module fastening hole 152 may be preferably formed to correspond to each other.

A second protrusion guide surface 224a having a front end bent toward an upper side is formed on a lower surface of the second protrusion portion 224. The second protrusion guide surface 224a comes contacts with a lower side of the optional module fastening hole 152 while the second protrusion portion 224 is coupled to the optional module fastening hole 152.

Accordingly, the second protrusion portion 224 may be easily inserted into the optional module fastening hole 152 along the curved surface of the second protrusion guide surface 224a in a state in which the front end of the second protrusion portion 224 is supported from the lower side of the optional module coupling hole 152 by the second protrusion guide surface 224a.

It is preferable that one second protrusion portion 224 is formed to correspond to the number of optional module fastening holes 152 as shown in FIG. 5, but the number of second protrusion portions 224 is not limited thereto, and may vary depending on the size of the optional module 200 like the first protrusion portion 223.

The inverter device 100 according to an embodiment of the present invention may further include a fixing member 400.

The fixing member 400 serves to fix the optional module 200 such that the optional module 200 is not separated from the main body housing 110 In a state where the first protrusion portion 223 is inserted into the optional module fastening groove 156 and the second protrusion portion 224 is inserted into the optional module fastening hole 152.

As shown in FIG. 4, the fixing member 400 preferably includes a head portion 410 and a screw portion 420, but the fixing member 400 is not limited to the embodiment, and various known components may be used. However, hereinafter, for convenience of description, the fixing member 400 is defined as having the head portion 410 and the screw portion 420.

In this case, the screw portion 420 may pass through the optional module cover 210 and the optional module housing 220, and a screw thread may be formed at a rear end of the screw portion 420 and may be screw-coupled to the fixing member fastening portion 1118 of the main body housing 110.

To this end, as shown in FIG. 4, the first through hole 212 is formed in the optional module cover 210 so that the screw portion 420 can pass therethrough. Further, as shown in FIG. 5, the second through hole 222 is formed at a position opposite to the first through hole 212 so that the screw portion 420 passing through the first through hole 212 can pass through the optional module housing 220 again. The screw portion 420 passes through the first through hole 212 and the second through hole 222 and is coupled to the fixing member fastening portion 1118 so that the optional module 200 is firmly fixed to the front surface 114 of the main body housing 110.

Meanwhile, the head portion 410 is formed at the front end of the screw portion 420 to prevent the screw portion 420 from passing through the optional module cover 210 and leaving the rear side.

In addition, in order to easily rotate the screw portion 420 and couple the screw portion 420 to the fixing member fastening portion 1118, cross groove may be formed on the front surface of the head portion 410 to rotate the fixing member 400 using a cross driver.

Although not shown in the drawings, the fixing member 400 may be rotatably fixed to the optional module cover 210 to prevent the fixing member 400 from being separated from the optional module 200 and being lost. Various known structures may be applied to the structure of fixing the fixing member 400 to the optional module cover 210. For example, a groove is formed in a front end portion of the screw portion 420 and is inserted into an inner circumferential surface of the first through hole 212 of the optional module cover 210 in the groove to prevent the screw portion 420 from leaving the first through hole 212 while being rotatable within the first through hole 212.

Figure 6:
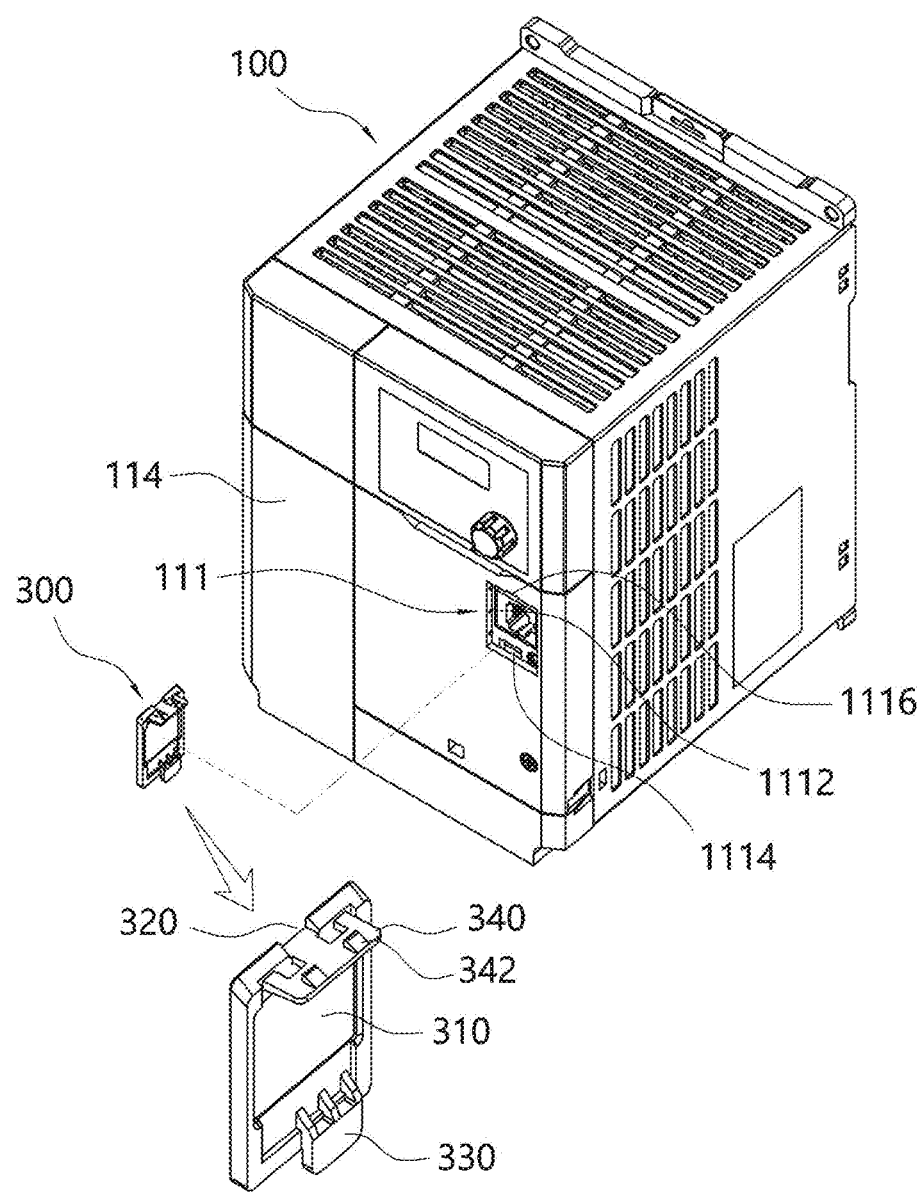
FIG. 6 is an enlarged perspective view of a cover of an inverter device according to an embodiment of the present disclosure.
Figure 7:
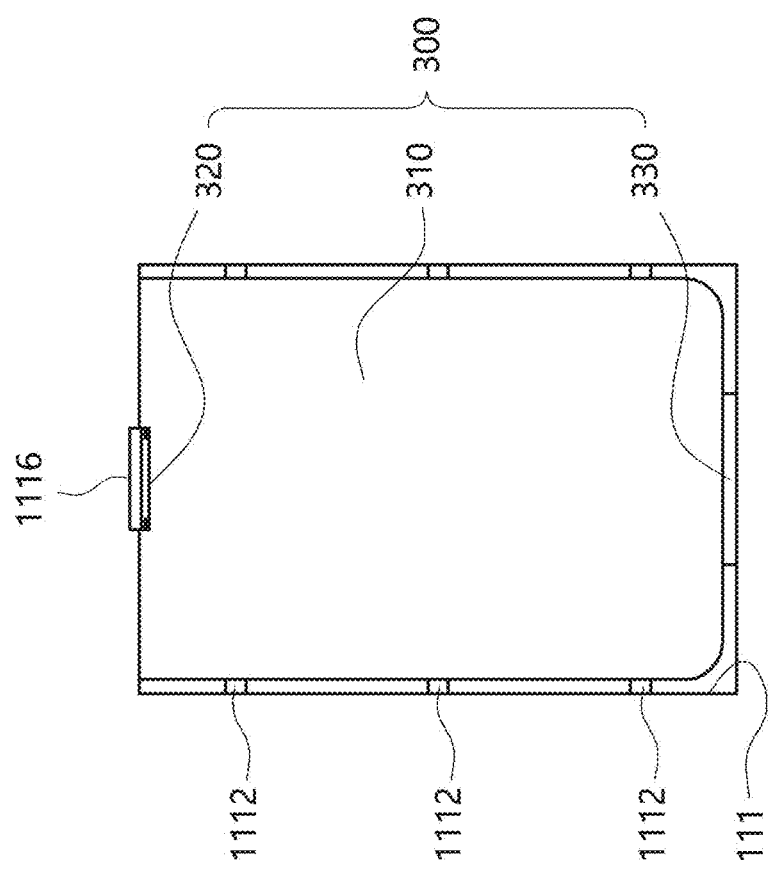
FIG. 7 is a view showing an enlarged cover of an inverter device according to an embodiment of the present disclosure.

Hereinafter, the inverter device 100 in a state in which the optional module 200 is not coupled will be described with reference to FIG. 6. In this case, FIG. 6 is an enlarged perspective view of a cover of an inverter device according to an embodiment of the present invention. FIG. 7 is an enlarged view showing a cover of an inverter device according to an embodiment of the present invention.

The inverter device 100 according to an embodiment of the present invention may further include a cover.

The cover 300 prevents the connection member insertion portion 130 to Which the connection member 240 of the optional module 200 is coupled from being exposed to the outside in a state in which the optional module 200 is not installed. To this end, the cover 300 includes a plate 310, a plate groove 320, and a first cover fastening portion 330.

The plate 310 of the cover 300 is formed in a plate shape to correspond to the cover seated groove 111. Accordingly, the plate 310 is seated in the cover seated groove 111.

In this case, it is preferable that a thickness of the cover 300 be formed to be the same as a depth of the concave formation of the cover seating groove 111. Accordingly, in the state in which the cover 300 is coupled to the cover seated groove 111, a height difference does not occur between the front surface 114 of the main body housing 110 and the cover 300 toward the front side.

As shown in FIG. 6, in order to prevent the cover 300 from being removed to the outside while the cover 300 is seated in the cover seated groove 111, at a lower end of the cover 300 a first cover fastening portion 330 is formed to protrude from a lower side of a rear surface of the cover 300 toward the rear side.

The first cover fastening portion 330 is inserted into a cover fastening hole 1114 formed in a lower portion of the cover seated groove 111. Accordingly, in the cover 300, the upper end portion of the cover 300 is coupled to the cover seated groove 111 or is separated from the cover seated groove 111 in a state in which the first cover fastening portion 330 is inserted into the cover fastening hole 1114.

A second cover fastening part 340 is formed to protrude from the upper end of the rear surface of the cover 300 to the rear side. A fixing protrusion 342 protruding upward is formed on the upper surface of the front end of the second cover fastening portion 340.

The second cover fastening portion 340 is elastically deformed in a state in which the first cover fastening portion 330 is coupled to the cover fastening hole 1114, and is inserted into the opening portion 112 of the cover seated groove 111. In more detail, when the cover 300 is seated in the cover seated groove 111, the second cover fastening portion 340 is elastically bent toward a lower side, and an upper surface of the second cover fastening portion 340 is in contact with an upper end of an inner circumferential surface of the opening portion 112 (see FIG. 3).

In this case, the fixing protrusion 342 of the second cover fastening portion 340 is caught on the inner surface of the main body housing 110 of the opening portion 112 by the restoring force of the second cover fastening portion 340 to prevent the second cover fastening portion 340 from being separated to the outside.

Meanwhile, as shown in FIG. 7, cover fixing protrusions 1112 is formed to protrude on both sides of an inner circumferential surface of the cover seated groove 111. In this case, the cover fixing protrusions 1112 are preferably formed in pairs so as to face each other on both sides as shown in FIG. 7, but the number is not limited thereto.

At this time, as shown in FIG. 7, both sides of the outer circumferential surface of the cover 300 are fitted into and fixed to the cover seated grooves 111 by the cover fixing protrusions 1112.

Meanwhile, as shown in FIG. 7, a plate groove portion 320 is formed at a position corresponding to a groove 1116 formed at an upper end of the cover seated groove 111. Accordingly, the user may easily separate the cover 300 from the cover seated groove 111 by inserting a rod into the space formed by the plate groove portion 320 and the groove 1116 of the cover seated groove 111.

In more detail, by inserting the rod into the space, a second cover fastening portion 340 is elastically deformed toward the lower side and the fixing protrusion 342 is separated from the opening portion 112 while the second cover fastening portion 340 is separated forward.

Figure 8:
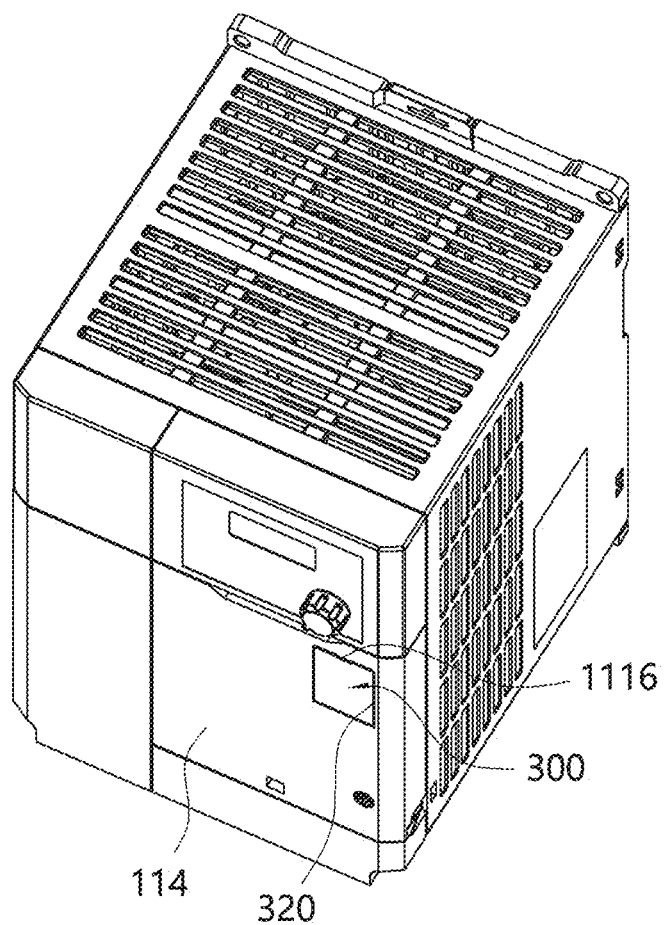
FIG. 8 is a view showing a state in which a cover is coupled to an inverter device according to an embodiment of the present disclosure.
Figure 9:
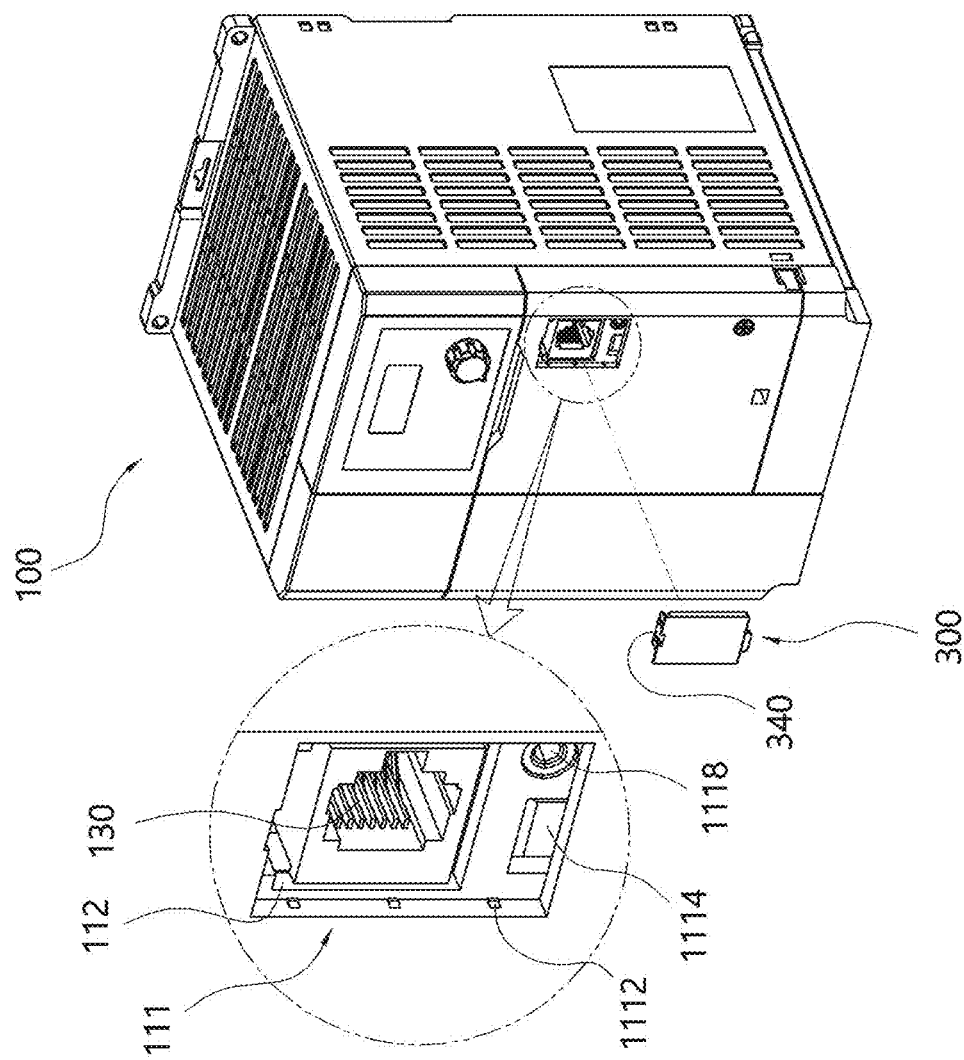
FIG. 9 is a view showing a state in which a cover is separated from an inverter device according to an embodiment of the present disclosure.
Figure 10:
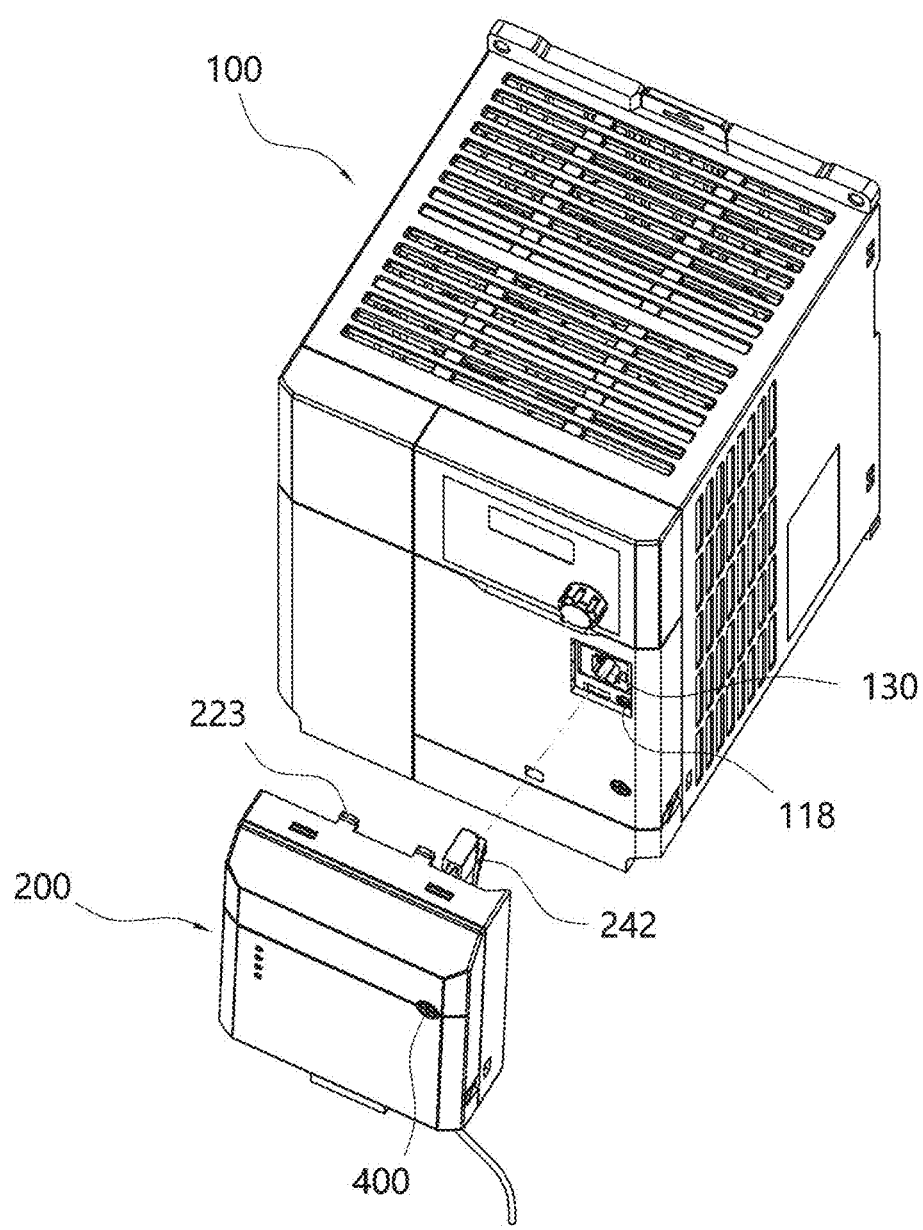
FIG. 10 is a view showing a state in which an optional module is separated from an inverter device according to an embodiment of the present disclosure.

Hereinafter, a process of coupling an optional module by the user will be described in detail with reference to FIGS. 8 to 10. In this case, FIG. 8 is a view showing a state in which a cover is coupled to an inverter device according to an embodiment of the present invention. FIG. 9 is a view showing a state in which a cover is separated from an inverter device according to an embodiment of the present invention. FIG. 10 is a view showing a state in which an optional module is separated from an inverter device according to an embodiment of the present invention.

As illustrated in FIG. 8, in a situation in which the optional module 200 is not coupled to the inverter device 100, the cover 300 is seated and fixed to the cover seated groove 111 to prevent foreign substances from entering into the main body housing 110 or the connection member insertion portion 130.

In this case, when the user inserts a rod into the space formed between the plate groove portion 320 and the groove portion 1116 of the cover seated groove 111 to separate the second cover fastening portion 340 and separates the first cover fastening portion 330 from the cover fastening hole 1114 to couple the optional module 200 to the inverter device 100, the cover 300 is separated from the cover seated groove 111 as illustrated in FIG. 9.

As illustrated in FIG. 10, the user disposes the optional module 200 in front of the main body housing 110 and couples the connector 242 protruding backward through the housing through hole 225 of the optional module 200 to the connection member insertion portion 130. Accordingly, the first circuit module (not shown) and the second circuit module 230 are electrically connected, and the user may use the inverter device 100 in which the optional module 200 is mounted through the manipulation portion 140.

In this case, the first protrusion portion 223 is inserted into the optional module fastening groove 156 and the second protrusion portion 224 is inserted into the optional module fastening hole 152 to firmly couple the optional module 200 to the front of the main body housing 110, and the screw portion 420 of the fixing member 400 is inserted into the first through hole 212 to couple the fixing member fastening portion 1118.

When the user rotates the fixing member 400 to firmly couple the fixing member fastening portion 1118, the optional module 200 is firmly fixed to the front of the main body housing 110 (see FIG. 1).

Although the inverter device including the optional module according to various embodiments of the present invention has been described above, it will be apparent to those skilled in the art that the coupling structure of the optional module according to the embodiments is not applicable only to the inverter device, and may be used as an electronic control device used in various environments to further couple and use the optional module in various fields of electronic control devices.

The preferred embodiments of the present invention will be described above, and it will be apparent to those skilled in the art that the present invention may be embodied in other specific forms without departing from the spirit and scope of the present invention. Therefore, the above embodiment should be considered as an example and not restrictive, and accordingly, the invention is not limited to the above description and may be modified within the scope of the appended claims and their equivalents.

What is claimed is:

1. The inverter device, comprising a main body housing in which an optional module is detachably installed and a first circuit module is disposed inside, wherein the inverter device, comprises:
    an optional module installation portion provided on a front surface of the main body housing to install the optional module;
    an opening portion formed in the optional module installation portion; and
    a connection member insertion portion disposed in the opening portion to connect a connection member provided in the optional module, and
    wherein the optional module installation portion comprises:
    at least one optional module fastening hole formed in the main body housing; and
    at least one optional module fastening groove spaced apart from the optional module fastening hole, and
    wherein the optional module comprises:
    an optional module housing at least one first protrusion portion coupled to the optional module fastening hole; and
    at least one second protrusion portion coupled to the optional module fastening groove having a second circuit module;
    wherein the connection member is capable of being coupled to the connection member insertion portion to allow the second circuit module to be electrically connected to the first circuit module; and
    wherein the connection member comprises:
    a connector inserted into the connection member insertion portion; and
    a cable formed of a flexible member to electrically connect the connector and the second circuit module.

2. The inverter device of claim 1, wherein the optional module fastening hole is formed at a lower side of a front surface of the main body housing, and
    wherein the optional module fastening groove is formed at an inner side of a through portion formed at an upper side of the optional module coupling hole.

3. The inverter device according to claim 1, further comprising:
    an manipulation unit disposed on a front surface of the main body housing to control the first circuit module,
    wherein the manipulation unit controls the first circuit module and the second circuit module connected to the first circuit module.

4. The inverter device of claim 1, further comprising:
    a fixing member fastening portion formed at one side of the opening portion; and
    a fixing member coupled to the fixing member fastening portion, and
    wherein the optional module comprises an optional module cover disposed in front of the second circuit module and coupled to the optional module housing, and
    wherein the fixing member passes through a first through hole formed in the optional module cover and a second through hole formed in the optional module housing to fix the optional module to the main body housing.

5. The inverter device according to claim 4, wherein the fixing member is rotatably fixed to the optional module cover or the optional module housing.

6. The inverter device of claim 4, wherein the fixing member comprises:
    a screw portion having one end thereof threadedly coupled to the fixing member fastening portion by passing through the first through hole and the second through hole; and
    a head portion formed at the other end of the screw portion to rotate the screw portion.

7. The inverter device of claim 1, wherein the first protrusion portion and the second protrusion portion are formed with an upward bend towards the front end,
    a first protrusion guide surface having a curved shape is formed on a lower surface of the first protrusion portion so that the optional module is coupled to the inverter device along the first protrusion portion, and
    a second protrusion guide surface having a curved shape is formed on a lower surface of the second protrusion portion so that the optional module is coupled to the inverter device along the second protrusion portion.

8. The inverter device of claim 1, further comprising:
    a cover covering the opening portion,
    wherein a cover seated groove formed around the opening portion to install the cover.

9. The inverter device of claim 8, wherein the cover comprises a plate formed to correspond to the cover seated groove,
    wherein at least one cover fixing protrusion is formed on an inner circumferential surface of the cover seated groove, and the plate is fitted into the cover seating groove by the cover fixing protrusion.

10. The inverter device of claim 9, comprises:
    a cover fastening hole formed in a lower portion of the cover seated groove, the cover comprises:
    a first cover fastening portion protruding from a lower side of the plate to be inserted into the cover fastening hole; and
    a second cover fastening portion protruding from an upper side of the plate toward the main body housing to be contacted with an inner circumferential surface of the opening portion and having a fixing protrusion protruding from a front end to prevent separation from the opening portion.

\* \* \* \* \*